(12) United States Patent
Hirano

(10) Patent No.: US 6,384,322 B2
(45) Date of Patent: May 7, 2002

(54) HERMETIC ENCLOSURE HAVING AIR PRESSURE ADJUSTABLE FUNCTION

(75) Inventor: Katsuya Hirano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/793,762

(22) Filed: Feb. 27, 2001

(30) Foreign Application Priority Data

Feb. 29, 2000 (JP) ........................................ 2000-057981

(51) Int. Cl.[7] ............................................... H02G 15/26
(52) U.S. Cl. ................................ 174/12 R; 174/17 VA
(58) Field of Search ........................... 174/12 R, 50.5, 174/50.51, 17 VA

(56) References Cited

U.S. PATENT DOCUMENTS

| | | | | |
|---|---|---|---|---|
| 4,448,130 A | * | 5/1984 | Speer ........................... | 102/498 |
| 5,519,184 A | * | 5/1996 | Umlas .................... | 219/121.64 |
| 5,546,700 A | * | 8/1996 | Kumpf ........................... | 47/79 |
| 5,629,495 A | * | 5/1997 | Sumida et al. ............. | 174/12 R |
| 5,677,477 A | * | 10/1997 | Man et al. ...................... | 73/37 |
| 6,098,474 A | * | 8/2000 | Sartain et al. .............. | 73/865.9 |
| 6,139,810 A | * | 10/2000 | Gottzmann et al. ......... | 422/197 |
| 6,229,088 B1 | * | 5/2001 | Launtz ..................... | 174/50.51 |

* cited by examiner

*Primary Examiner*—Dean A. Reichard
*Assistant Examiner*—Adolfo Nino
(74) *Attorney, Agent, or Firm*—Sughrue Mion, PLLC

(57) ABSTRACT

A hermetic enclosure having an air pressure adjustable function, which can adjust inside air pressure of the hermetic enclosure, is provided. In order to prevent devices in the hermetic enclosure from corroding, the hermetic enclosure having an air pressure adjustable function provides a main body having a clearance part and a packing fixing groove, a door, and packing that is fixed to the packing fixing groove of the main body. And the door is jointed with the main body by placing the packing between the door and the main body in a state that the door is able to slide on the packing. And when inside and outside air pressure of the hermetic enclosure becomes different, the door moves on the packing and the clearance part of the main body is changed, and the inside and outside air pressure is adjusted to be almost equal.

23 Claims, 8 Drawing Sheets

FIG. 4
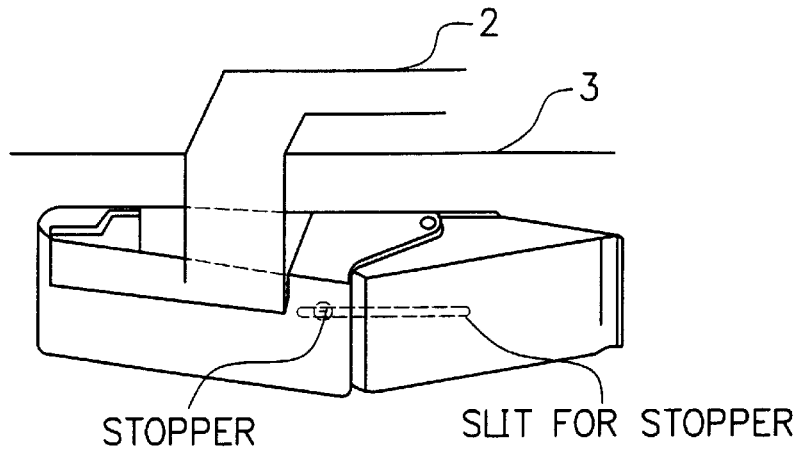
STOPPER    SLIT FOR STOPPER
FIG. 5A
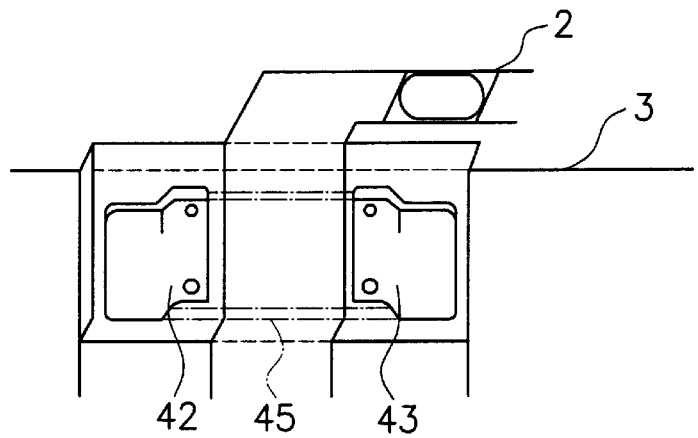
FIG. 5B
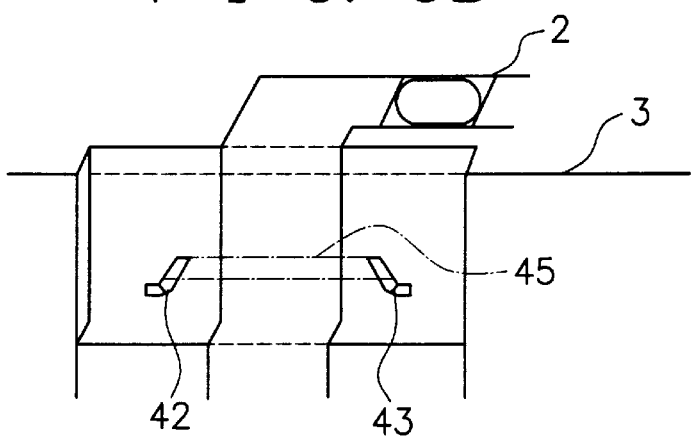
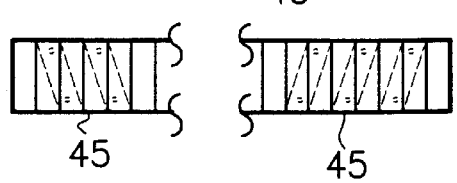

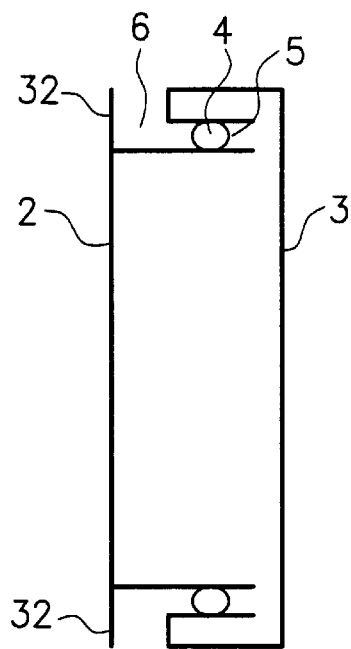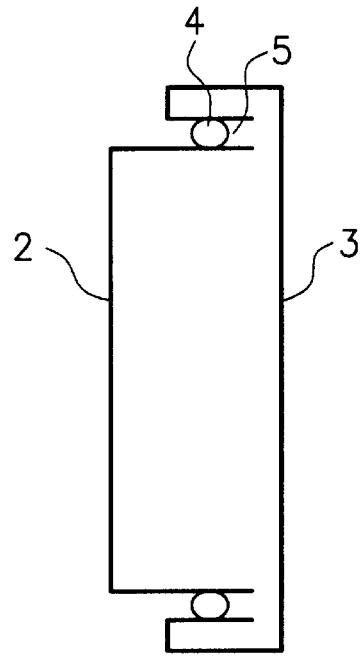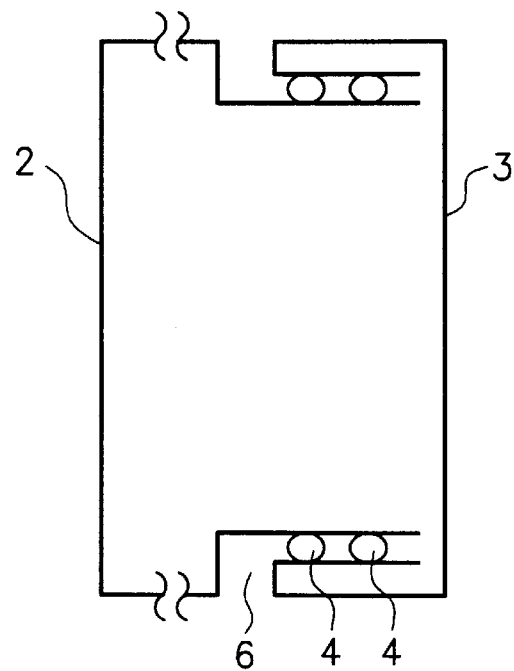

HERMETIC ENCLOSURE HAVING AIR PRESSURE ADJUSTABLE FUNCTION

BACKGROUND OF THE INVENTION

The present invention relates to a hermetic enclosure having an air pressure adjustable function using for such as communication equipment.

Description of the Related Art

At a conventional enclosure, in order to adjust its air pressure, an air pressure adjusting hole is provided. Consequently, it is actually impossible to keep its hermetic state at the conventional enclosure. And there is a following problem at the conventional enclosure.

At the conventional enclosure such as for communication equipment, the outside air flows into the enclosure and the inside air flows out from the enclosure caused by the air pressure difference between the inside and outside of the enclosure. And the outside air contains much corrosive gas such as vapor and oxygen, consequently there is a problem that the corrosion speed of devices in the enclosure is made to be fast.

SUMMARY OF THE INVENTION

It is therefore an object of the present invention to provide a hermetic enclosure having an air pressure adjustable function that can adjust inside air pressure of the hermetic enclosure in a state that its hermetic state of the hermetic enclosure is kept, when inside and outside air pressure of the hermetic enclosure becomes different.

According to a first aspect of the present invention, there is provided a hermetic enclosure having an air pressure adjustable function, which changes the volume of a hermetic enclosure so that inside air pressure of the hermetic enclosure is made to be almost equal to outside air pressure when the inside air pressure of the hermetic enclosure is different from the outside air pressure.

According to a second aspect of the present invention, there is provided a hermetic enclosure having an air pressure adjustable function, in which a main body of the hermetic enclosure or a door of the hermetic enclosure is movable, and which moves the main body or the door of the hermetic enclosure so that the volume of the hermetic enclosure is changed.

According to a third aspect of the present invention, in the second aspect, the volume of the hermetic enclosure is changed by making the main body or the door of the hermetic enclosure move so that inside air pressure of the hermetic enclosure is made to be almost equal to outside air pressure.

According to a fourth aspect of the present invention, in the second and the third aspects, the main body and the door of the hermetic enclosure are jointed with a sliding means.

According to a fifth aspect of the present invention, in the second and the third aspect, the hermetic enclosure changes the volume of the hermetic enclosure by making a clearance between the main body and the door of the hermetic enclosure increase or decrease in one axis direction or the circumference direction.

According to a sixth aspect of the present invention, in the second and third aspect, the hermetic enclosure having an air pressure adjustable function provides a separation preventing means that prevents the main body and the door of the hermetic enclosure from separating.

According to a seventh aspect of the present invention, in the first and the third aspect, the hermetic enclosure having an air pressure adjustable function provides an air pressure detecting means for detecting the inside and outside air pressure of the hermetic enclosure or an air pressure difference between the inside and outside of the hermetic enclosure.

According to an eighth aspect of the present invention, there is provided a hermetic enclosure having an air pressure adjustable function. The hermetic enclosure having the air pressure adjustable function provides a main body having a clearance part and a packing fixing groove, door, and packing that is fixed to the packing fixing groove of the main body. And the door is jointed with the main body by placing the packing between the door and the main body in a state that the door is able to slide on the packing. And when inside and outside air pressure of the hermetic enclosure becomes different, the door moves on the packing and the clearance part of the main body is changed, and the inside and outside air pressure is adjusted to be almost equal.

According to the present invention, when the inside and outside air pressure of the hermetic enclosure becomes different, the door of the hermetic enclosure moves and the volume of the hermetic enclosure is changed in a state that the hermetic state of the hermetic enclosure is kept. That is, in a state that the outside air does not enter into the hermetic enclosure, the air pressure difference between the inside and outside of the hermetic enclosure is made to be almost equal. Consequently, the inside of the hermetic enclosure keeps its water proof and rust preventive functions, and applying an unnecessary stress to the hermetic enclosure can be avoided.

BRIEF DESCRIPTION OF THE DRAWINGS

The objects and features of the present invention will become more apparent from the consideration of the following detailed description taken in conjunction with the accompanying drawings in which:

FIG. 4 is a perspective view showing a structure of a separation preventing means used a punch type lock at the first embodiment of the present invention;

FIGS. 5A and 5B are perspective views showing a structure of a separation preventing means used a stopper at the first embodiment of the present invention;

FIGS. 6A and 6B are sectional views showing other structures of the first embodiment of the hermetic enclosure having the air pressure adjustable function of the present invention;

FIG. 7 is a sectional view showing a structure of a second embodiment of the hermetic enclosure having the air pressure adjustable function of the present invention;

DESCRIPTION OF THE PREFERRED EMBODIMENTS

Figure 1:
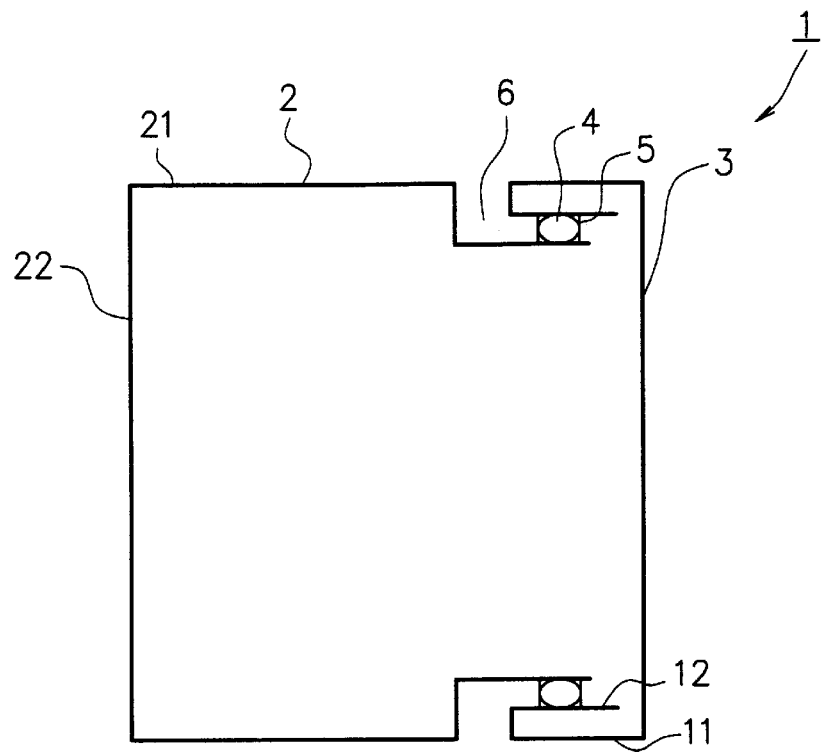
FIG. 1 is a sectional view showing a structure of a first embodiment of a hermetic enclosure having an air pressure adjustable function of the present invention.

Referring now to the drawings, embodiments of the present invention are explained in detail. FIG. 1 is a sectional view showing a structure of a first embodiment of a hermetic enclosure having an air pressure adjustable function of the present invention. As shown in FIG. 1, a hermetic enclosure 1 having an air pressure adjustable function at the first embodiment of the present invention consists of a main body 2, a door 3, packing 4, a packing fixing groove 5 formed in the main body 2, and a clearance 6 formed at a part of the main body 2. The packing 4 is mounted in the packing fixing groove 5 of the main body 2, and the door 3 slides on the packing 4. The main body 2 provides a clearance forming part 21, and a bottom part 22. The main body 2 joints with the door 3 by placing the packing 4 between them. Consequently, the inside of the hermetic enclosure 1 is shielded from the outside air and the hermetic state of the hermetic enclosure 1 is kept, and this hermetic state can be kept for a long period of time.

When the air pressure inside the hermetic enclosure 1 is defined as Pi, the air pressure outside the hermetic enclosure 1 is defined as Po, and the air pressure difference between them is defined as ΔP, ΔP=Po−Pi. At the present invention, when the air pressure difference ΔP is a negative value, the volume of the hermetic enclosure 1 is increased, and when the ΔP is a positive value, the volume of the hermetic enclosure 1 is decreased. That is, the volume of the hermetic enclosure 1 is changed freely by moving the door 3 so that the ΔP actually becomes 0.

Figures 2A, 2B, 2C:
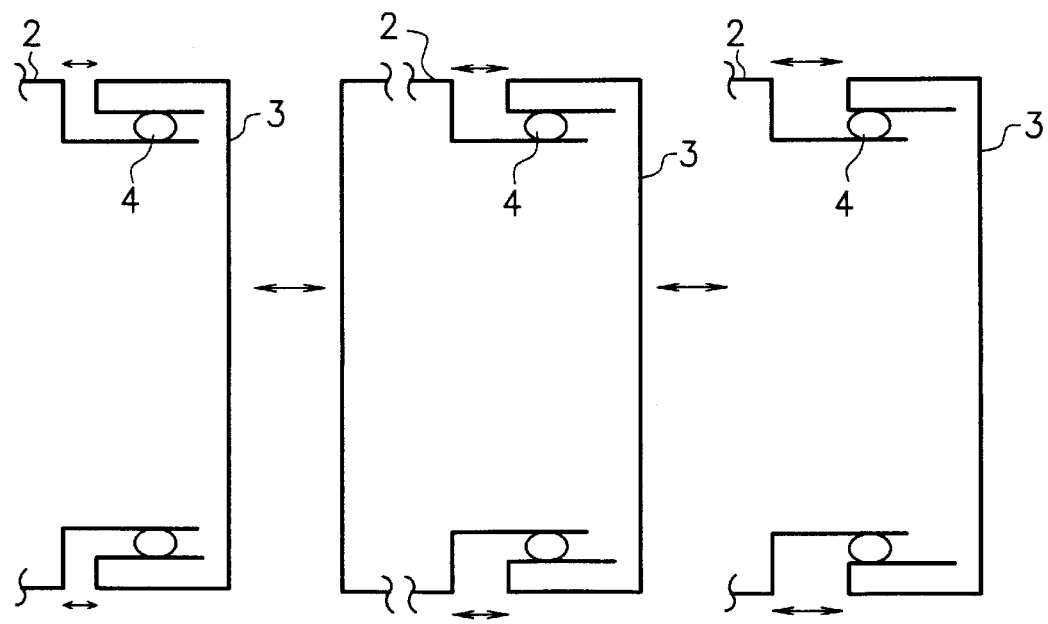
FIG. 2A is a sectional view showing a state that the volume of the hermetic enclosure of the present invention is a minimum value.
FIG. 2B is a sectional view showing a state that the air pressure inside and outside the hermetic enclosure of the present invention is balanced at a normal state.
FIG. 2C is a sectional view showing a state that the volume of the hermetic enclosure of the present invention is a maximum value.

Next, the movement of the hermetic enclosure 1 having the air pressure adjustable function of the present invention is explained. FIG. 2A is a sectional view showing a state that the volume of the hermetic enclosure 1 of the present invention is a minimum value. FIG. 2B is a sectional view showing a state that the air pressure inside and outside the hermetic enclosure 1 of the present invention is balanced at a normal state. FIG. 2C is a sectional view showing a state that the volume of the hermetic enclosure 1 of the present invention is a maximum value. At the present invention, the hermetic enclosure 1 is set in the normal state shown in FIG. 2B at the beginning so that the clearance 6 is positioned at the standard position at the time when the air pressure difference ΔP=0 Pa (pascal), at that the air pressure is a normal value.

And as shown in FIG. 2A, when the inside air pressure Pi of the hermetic enclosure 1 becomes lower than the outside air pressure Po, the door 3 is moved toward the main body 2. That is, the air pressure difference ΔP becomes a positive value, and the clearance 6 is decreased and the volume of the hermetic enclosure 1 is decreased. Consequently, the air pressure difference ΔP becomes 0, and it is avoided that an unnecessary stress is applied to the hermetic enclosure 1.

And as shown in FIG. 2C, when the inside air pressure Pi becomes higher than the outside air pressure Po, that is, the air difference ΔP becomes a negative value, and the clearance 6 is increased and the volume of the hermetic enclosure 1 is increased. Consequently, the air pressure difference ΔP becomes 0, and it is avoided that an unnecessary stress is applied to the hermetic enclosure 1.

During these movements, the door 3 slides on the packing 4, therefore the hermetic state of the hermetic enclosure 1 is kept, and even when the change of the air pressure inside and outside the hermetic enclosure 1 occurs, the balance of the air pressure inside and outside the hermetic enclosure 1 can be kept.

At the first embodiment of the present invention, as shown in FIGS. 1 and 2, the sectional shape of the packing 4 provided in the sliding mechanism is round or elliptic. This sliding mechanism consists of the door 3 and the packing 4, and the packing 4 is mounted in the packing fixing groove 5. At the first embodiment, the packing 4 is mounted in the packing fixing groove 5 in the main body 2. However, the packing fixing groove 5 can be formed in the door 5 instead of in the main body 2, and the packing 4 can be mounted in the packing fixing groove 5 in the door 3. In this case, the sliding surface is positioned on the surface of the main body 2, facing the door 3 provided the packing fixing groove 5. At the first embodiment, the sliding surface is positioned on the surface of the door 3, facing the main body 2 provided the packing fixing groove 5.

As shown in FIG. 1, the door 3 provides a side wall part 11 and a folded part 12 formed in the parallel direction to the side wall part 11. Therefore, at the case that the packing fixing groove 5 is provided in the door 3, the packing fixing groove 5 is formed at the folded part 12.

As mentioned above, the packing fixing groove 5 is formed either in the main body 2 or the door 3.

Figure 3A:
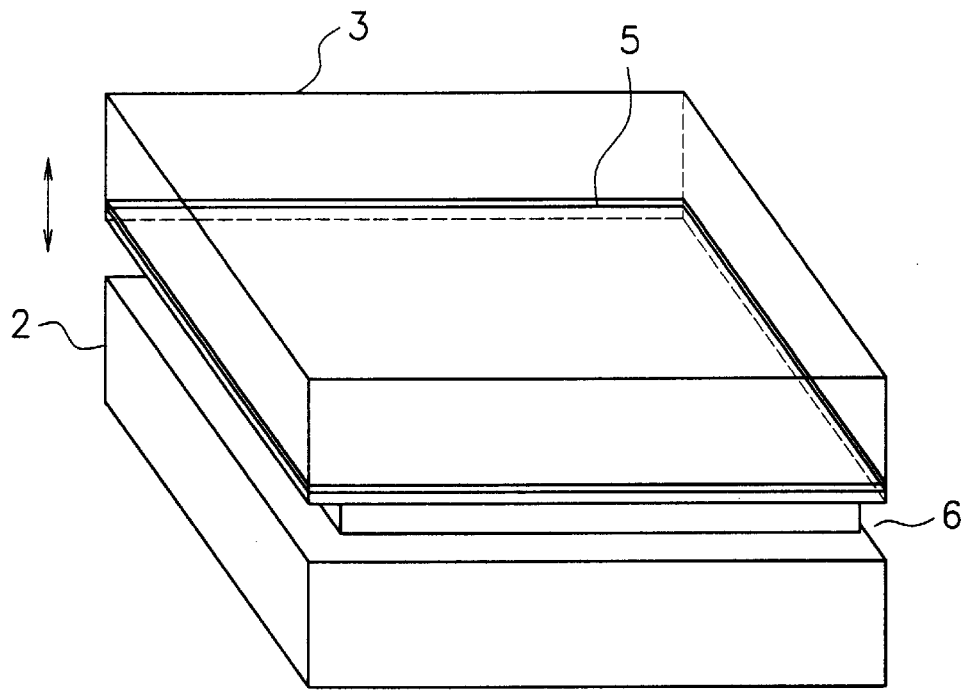
FIG. 3A is a perspective view showing a structure of a packing fixing groove formed in all the inside surfaces of the folded part of a door at the first embodiment of the present invention.
Figure 3B:
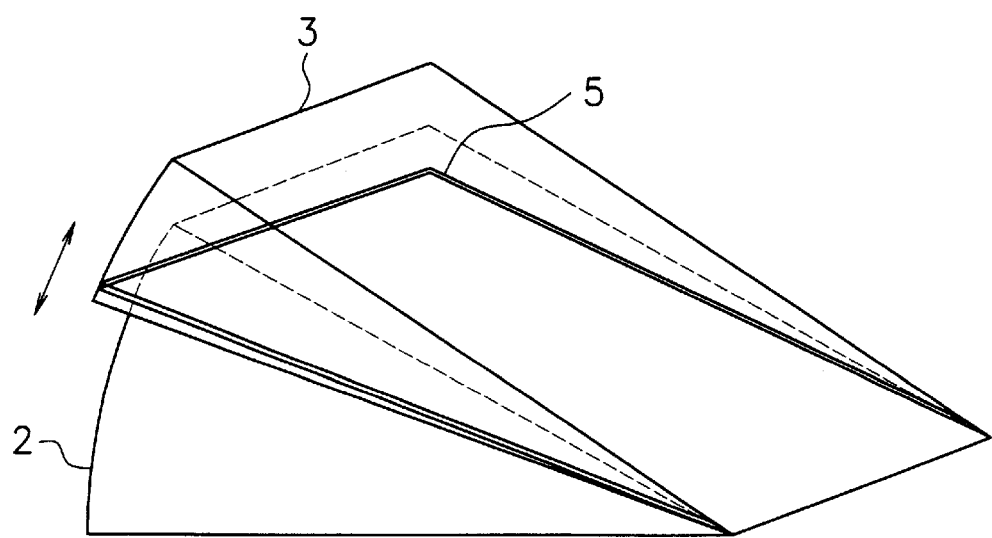
FIG. 3B is a perspective view showing a structure of the packing fixing groove formed in three inside surfaces of the folded part of a door at the first embodiment of the present invention.

FIG. 3A is a perspective view showing a structure of the packing fixing groove 5 formed in all the inside surfaces of the folded part of the door 3 at the first embodiment of the present invention. FIG. 3B is a perspective view showing a structure of the packing fixing groove 5 formed in three inside surfaces of the folded part of the door 3 at the first embodiment of the present invention. And in FIGS. 3A and 3B, the packing fixing groove 5 is shown. As shown in FIGS. 3A and 3B, the packing fixing groove 5 can be formed in various structures depending on the shapes of the main body 2 and the door 3. As mentioned above, at the first embodiment of the present invention, when the outside air pressure changed, in order to relax the stress applying to the hermetic enclosure 1, caused by the air pressure difference between the inside and outside the hermetic enclosure 1, the volume of the hermetic enclosure 1 is made to change by moving the door 3.

The size of the changing volume of the hermetic enclosure 1 is decided by the size of the clearance 6. The size of the clearance 6 can be set arbitrarily, therefore the present invention can be applied to any hermetic enclosure having various sizes.

The minimum volume of the hermetic enclosure 1 is shown at that the clearance 6 is at the position shown in FIG. 2A, and the maximum volume of the hermetic enclosure 1 is shown at that the clearance 6 is at the position shown in FIG. 2C. In FIG. 2A, at the case that the hermetic enclosure 1 is at the minimum volume, the tip of the door 3 may touch the main body 2. In this case, at least either the touching part of the main body 2 or that of the door 3 can be formed by an elastic material such as rubber and a spring. By using this material, the hermetic enclosure 1 can be prevented from deforming when the door 3 moved suddenly. At the case that the rubber is used as the elastic material, the touching part can be formed by a material covered with the rubber.

When the air pressure difference ΔP becomes a negative value, that is, the hermetic enclosure 1 becomes the maximum volume as shown in FIG. 2C. In order to prevent that the door 3 is separated from the main body 2, it is desirable to provide a separation preventing means. FIG. 4 is a perspective view showing a structure of a separation preventing means used a punch type lock at the first embodiment of the present invention. FIGS. 5A and 5B are perspective views showing a structure of a separation preventing means used a stopper at the first embodiment of the present invention. As shown in FIG. 4, when the door 3 is moved to the limit position, the punch type lock works and the door does not move any farther. And as shown in FIGS. 5A and 5B, a supporting component 42 is fixed to the main body 2, a supporting component 43 is fixed to the door 3, and a three fold chain 45 using such as a wristwatch band is jointed with these supporting components 42 and 43. One or more this separation preventing means can be used at the embodiment of the present invention.

FIGS. 6A and 6B are sectional views showing other structures of the first embodiment of the hermetic enclosure 1 having the air pressure adjustable function of the present invention. As shown in FIG. 6A, at this embodiment, a part of the main body 2 is covered with the door 3, in this case, a stopper 32 is provided at the main body 2. And at the case shown in FIG. 6B, a part of the main body 2 is covered with the door 3, but the stopper 32 is not provided.

Next, a second embodiment of the present invention is explained. FIG. 7 is a sectional view showing a structure of the second embodiment of the hermetic enclosure 1 having the air pressure adjustable function of the present invention. As shown in FIG. 7, at the second embodiment, plural packing 4 are provided. In FIG. 7, the number of the packing 4 is two, however the number of the packing 4 is not limited to two, and two or more packing 4 can be used. In this case, the number of packing fixing grooves 5 is equal to the number of the packing 4. And the other functions are the same that the first embodiment has. That is, the packing fixing grooves 5 can be formed on the main body 2 or the door 3, and the sliding surfaces are the opposite side of the surface in which the packing fixing grooves 5 are formed.

Figure 8A:
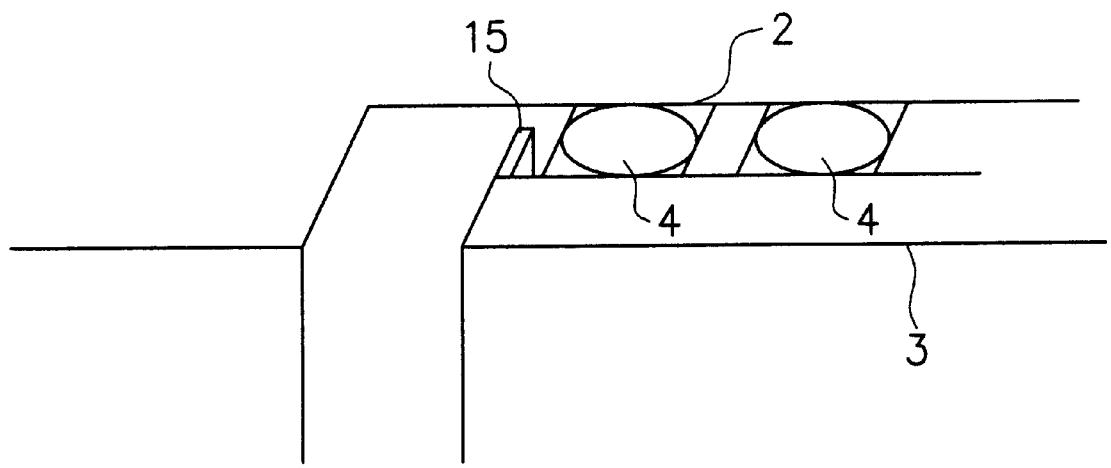
FIGS. 8A and 8B are sectional views showing structures of a sliding part having plural packing of the second embodiment of the hermetic enclosure having the air pressure adjustable function of the present invention.
Figure 8B:
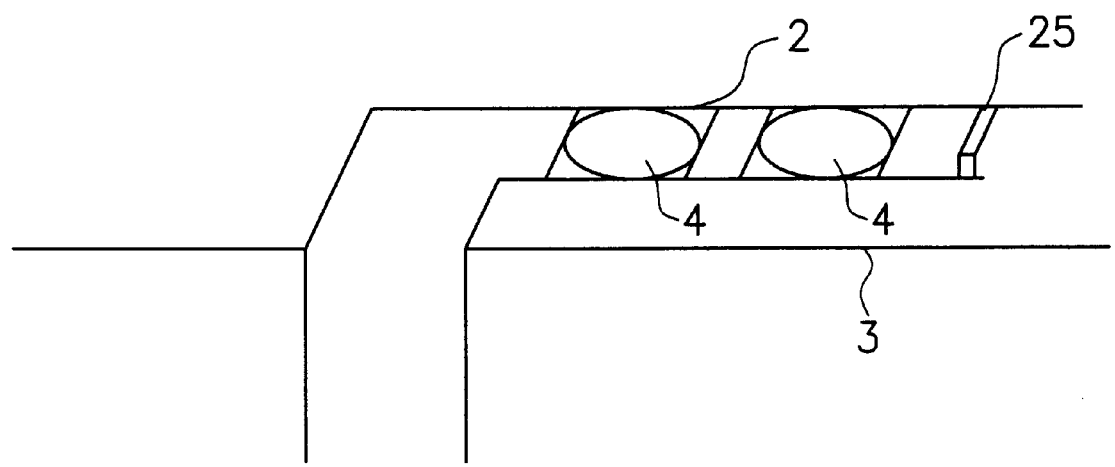

FIGS. 8A and 8B are sectional views showing structures of the sliding part having the plural packing 4 of the second embodiment of the hermetic enclosure 1 having the air pressure adjustable function of the present invention. As shown in FIG. 8A, a stopper 15 is provided at the end of the sliding part, and as shown in FIG. 8B, a stopper 25 is provided at the other end of the sliding part. These stoppers 15 and 25 can be used as the separation preventing means mentioned at the first embodiment. Instead of using the stoppers 15 and 25, one of the plural packing 4 can be used as a stopper by fixing one of the plural packing 4 at the opposite surface of the packing fixing groove 5. At the second embodiment, the other functions are the same that the first embodiment has. For example, the sectional shape of the packing 4 is the same that the first embodiment has.

Figure 9A:
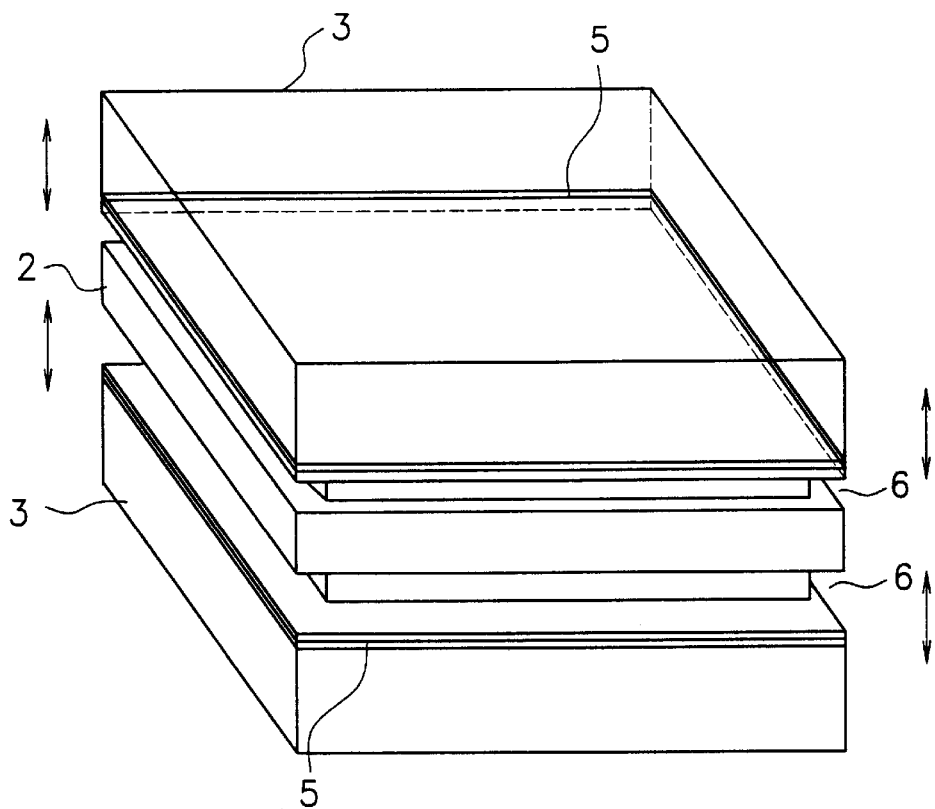
FIGS. 9A and 9B are perspective views showing structures of a third embodiment of the hermetic enclosure having the air pressure adjustable function of the present invention.
Figure 9B:
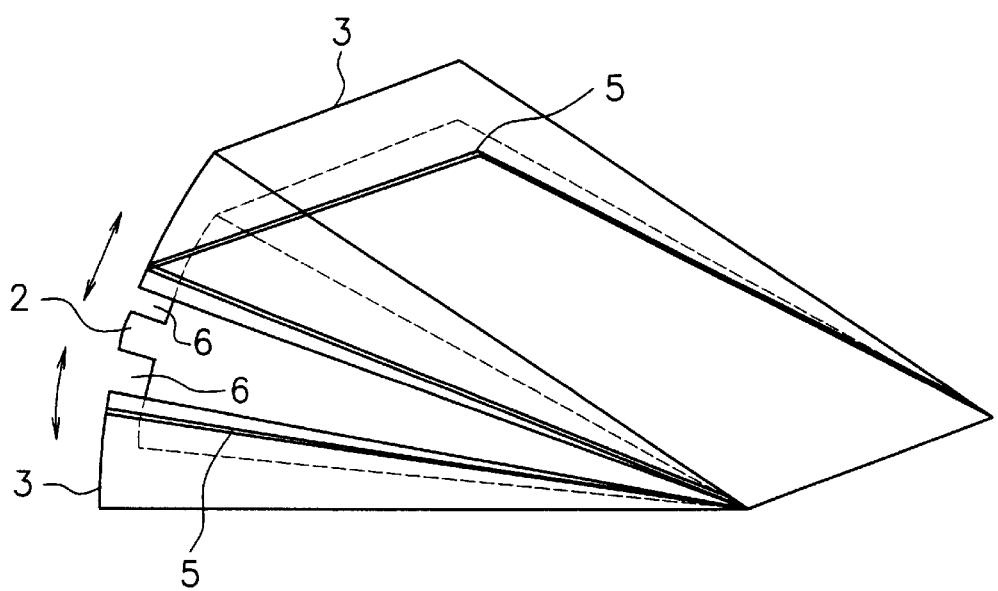

Next, a third embodiment of the present invention is explained. FIGS. 9A and 9B are perspective views showing structures of the third embodiment of the hermetic enclosure having the air pressure adjustable function of the present invention. As shown in FIGS. 9A and 9B, plural doors 3 are provided at the third embodiment. In FIG. 9A, the packing fixing groove 5 is provided at all the inside surfaces of the folded part of each of the doors 3, and in FIG. 9B, the packing fixing groove 5 is provided at three inside surfaces of the folded part of each of the doors 3. In this, the packing fixing grooves 5 are shown. However, the packing fixing grooves 5 can be formed at both sides of the main body 2, where the doors 3 are jointed with, instead of at the doors 3. And at the third embodiment, the number of the packing fixing grooves 5 is not limited to one, and one or more packing fixing grooves 5 can be formed, together with the number of the packing 4.

Figure 10A:
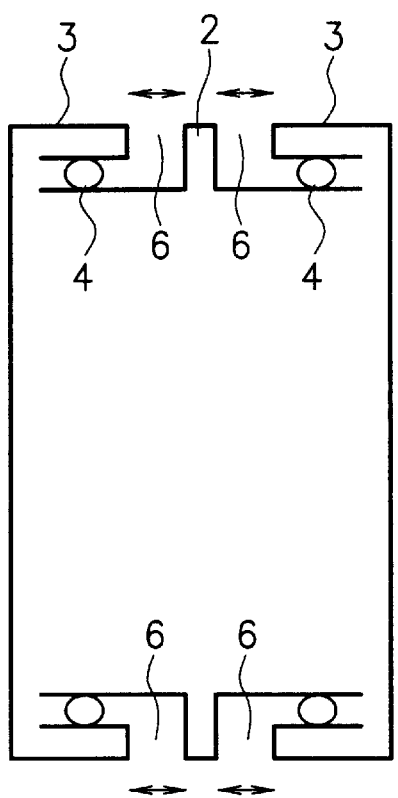
FIGS. 10A and 10B are sectional views showing structures of the third embodiment of the hermetic enclosure having the air pressure adjustable function of the present invention.
Figure 10B:
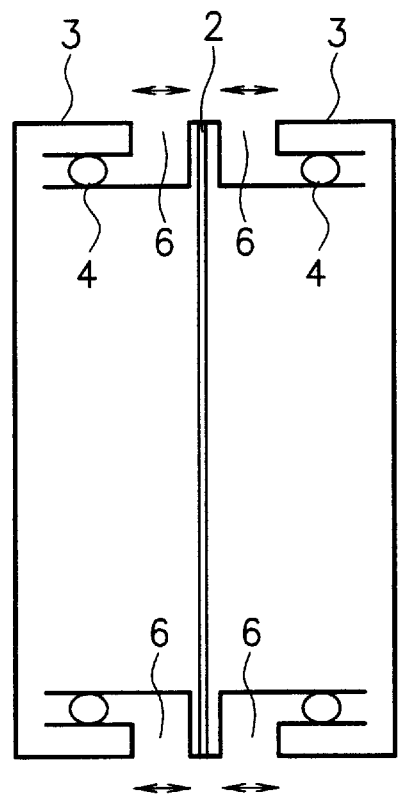

FIGS. 10A and 10B are sectional views showing structures of the third embodiment of the hermetic enclosure having the air pressure adjustable function of the present invention. In FIG. 10B, a supporting component is added at the center of the main body 2. As shown in FIGS. 10A and 10B, the plural doors 3 are jointed with the main body 2, placing the packing 4 between each of the doors 3 and the both sides of the main body 2. The movement of each of the doors 3 is equivalent to the first embodiment. The other functions are the same that the first embodiment has. For example, the number of the packing fixing grooves 5 can be one or more, together with the number of the packing 4.

Figure 11:
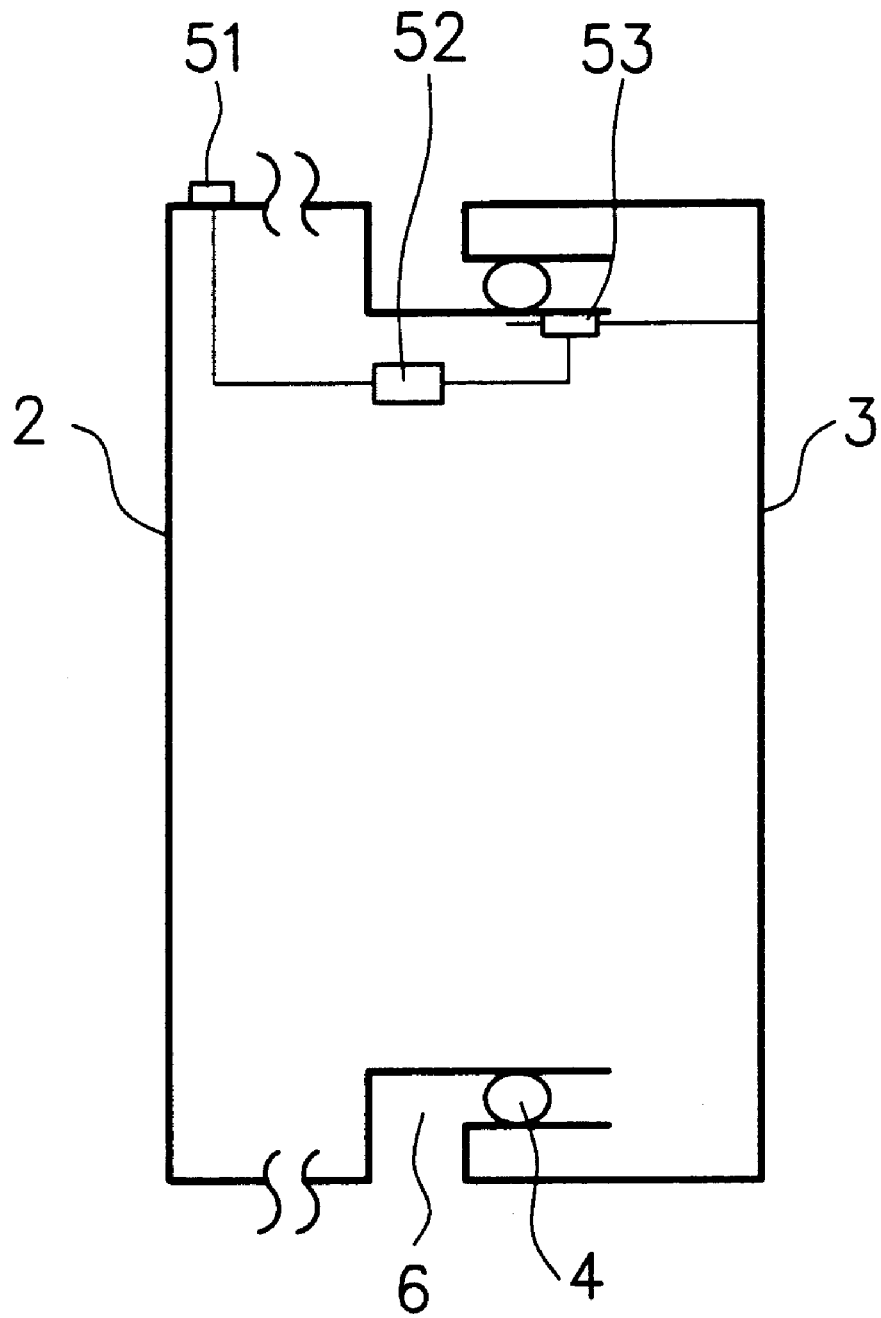
FIG. 11 is a sectional view showing a structure of a fourth embodiment of the hermetic enclosure having the air pressure adjustable function of the present invention.

Next, a fourth embodiment of the present invention is explained. FIG. 11 is a sectional view showing a structure of the fourth embodiment of the hermetic enclosure having the air pressure adjustable function of the present invention. As shown in FIG. 11, at the fourth embodiment, an air pressure detecting means 51, such as an air pressure sensor, is provided at the main body 2 and/or the door 3. And further, at the fourth embodiment, a door moving means 53, which moves the door 3 so that the air pressure difference ΔP becomes 0 at the time when the ΔP is not 0, by considering the friction factors μ between the packing 4 and the sliding part of the main body 2 or the door 3.

That is, as shown in FIG. 11, at the fourth embodiment of the present invention, by using a value (air pressure or air pressure difference) detected at the air pressure detecting means 51, the door 3 is moved and the air pressure difference ΔP is made to be 0. With this, the stress applying to the hermetic enclosure 1 is decreased, and the hermetic enclosure 1 can be prevented from deforming or damaging of metal fatigue.

Actually, at the fourth embodiment of the present invention, an air pressure detecting and door moving means is provided. This air pressure detecting and door moving means provides the air pressure detecting means 51, which can detect the air pressure or the air pressure difference ΔP between the outside and inside air pressure of the hermetic enclosure 1, a moving distance deciding means 52, and the door moving means 53. The moving distance deciding means 52 judges whether the air pressure difference ΔP is a positive value or a negative value by using the ΔP detected directly, or by calculating the ΔP based on the air pressure detected at the air pressure detecting means 51, and informs the door moving means 53 of the moving distance. And the door moving means 53 makes the clearance 6 increase or decrease based on the moving distance information from the moving distance deciding means 52, and the volume of the hermetic enclosure 1 is increased or decreased. Further, a feedback means can be newly provided, and by detecting the change of the volume of the hermetic enclosure 1, the feedback means executes the feedback of the detected change and changes the volume of the hermetic enclosure 1 more suitable. That is, the air pressure detecting means 51 detects the change of the air pressure difference caused by that the volume of the hermetic enclosure 1 was increased or decreased by the door moving means 53, and informs the feedback means of the detected result.

At the fourth embodiment, the maximum volume Vmax of the hermetic enclosure 1 can be set. And at the case that the hermetic enclosure 1 became the maximum volume Vmax, and the outside air pressure was still low, this Vmax can be used. In this case, the stoppers mentioned above can be omitted. Further, one or more the air pressure detecting means 51 and the door moving means 53 can be provided.

At the fourth embodiment, it is possible to set that the door 3 is moved only at the case that the air pressure difference ΔP exceeded a threshold value Pth, by releasing the stopper of the door 3. With this, the door 3 is not moved until the air pressure difference ΔP reaches the threshold value Pth, therefore electric power for moving the door 3 can be saved. And the threshold value Pth is set to be in a range that the hermetic enclosure 1 is not deformed, therefore deforming the hermetic enclosure 1 can be prevented.

At the embodiments of the present invention, the packing 4 is not limited to special packing, and as the packing, existing packing can be used. Further, packing contained a synthetic resin material having elasticity, or packing used a soft metal such as copper, aluminum, lead, and other metal, or packing combined with an elastic material and the soft metal can be used. And at the sliding part, in addition to the packing 4, skids can be used, or instead of the packing material, the skids can be used as the packing 4. As these skids, a liquid type or a solid type can be used, but as the packing 4, the solid type is used. This material using at the sliding part keeps the hermetic state of the hermetic enclosure 1, by that the air pressure difference ΔP between the outside and inside the hermetic enclosure 1 is made to 0 by making the part of the hermetic enclosure 1 move.

At the present invention, as mentioned above, when the air pressure difference ΔP occurs between the inside and outside of the hermetic enclosure 1, the volume of the hermetic enclosure 1 is changed and the air pressure difference ΔP is decreased. With this, the stress applying to the hermetic enclosure 1 is decreased, and this prevents the hermetic enclosure 1 from deforming and damaging. Further, when a vapor absorbing material or an oxygen absorbing material is additionally put into the hermetic enclosure 1, even if the hermetic state of the hermetic enclosure 1 is decreased, or outside air enters into the hermetic enclosure 1, the deterioration of devices inside the hermetic enclosure 1 can be prevented actually, and the hermetic state of the hermetic enclosure 1 can be kept actually. As the vapor absorbing material or the oxygen absorbing material, an existing material can be used.

And at the present invention, within the range of the strength of the material forming the hermetic enclosure 1, the inside air pressure of the hermetic enclosure 1 can be adjusted to air pressure being different from the outside air pressure. For example, by that the inside air pressure of the hermetic enclosure 1 is set to be a little higher than the outside air pressure, and even when the hermetic state of the hermetic enclosure 1 decreases, the outside air is prevented from entering into the hermetic enclosure 1. In this case, a gas storing means is provided, and an inert gas is stored in this gas storing means, and further an air pressure adjusting means is provided so that the inside air pressure of the hermetic enclosure 1 is kept to be higher than the outside air pressure. This can be executed by using the means mentioned at the fourth embodiment of the present invention.

As mentioned above, at the present invention, when outside air pressure increases, inside air pressure of an hermetic enclosure can be increased, with keeping the hermetic state of the hermetic enclosure, that is, the air pressure difference ΔP between the inside and outside of the hermetic enclosure can be kept to be 0. And when the outside air pressure decreases, the inside air pressure of the hermetic enclosure can be decreased, with keeping the hermetic state of the hermetic enclosure, that is, the air pressure difference ΔP between the inside and outside of the hermetic enclosure can be kept to be 0.

A hermetic enclosure of the present invention provides a main body, a movable door, and packing. And the application of the present invention is not limited to a special hermetic enclosure, and the present invention can be applied to electronic instruments such as a cellular phone, radio equipment, a display for a personal computer, and electronic equipment. Further, the size of the hermetic enclosure of the present invention is not limited to a special size, and the present invention can be also used for a relatively large size hermetic enclosure.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A hermetic enclosure having an air pressure adjustable function, including a door movable relative to a main body to which it is coupled which changes the volume of said hermetic enclosure by movement of the door relative to the main body so that inside air pressure of said hermetic enclosure is made to be almost equal to outside air pressure when said inside air pressure of said hermetic enclosure is different from said outside air pressure.

2. A hermetic enclosure having an air pressure adjustable function in accordance with claim 1, comprising:
    an air pressure detecting means for detecting said inside and outside air pressure of said hermetic enclosure or an air pressure difference between said inside and outside of said hermetic enclosure.

3. A hermetic enclosure having an air pressure adjustable function, in which a main body of said hermetic enclosure or a door of said hermetic enclosure is movable, and which moves said main body or said door of said hermetic enclosure so that the volume of said hermetic enclosure is changed.

4. A hermetic enclosure having an air pressure adjustable function in accordance with claim 3, wherein:
    said main body and said door of said hermetic enclosure are jointed with a sliding means.

5. A hermetic enclosure having an air pressure adjustable function in accordance with claim 3, wherein:
    said hermetic enclosure changes said volume of said hermetic enclosure by making a clearance between said main body and said door of said hermetic enclosure increase or decrease in one axis direction or the circumference direction.

6. A hermetic enclosure having an air pressure adjustable function in accordance with claim 3, comprising:
    a separation preventing means that prevents said main body and said door of said hermetic enclosure from separating.

7. A hermetic enclosure having an air pressure adjustable function in accordance with claim 3, wherein:

said volume of said hermetic enclosure is changed by making said main body or said door of said hermetic enclosure move so that inside air pressure of said hermetic enclosure is made to be almost equal to outside air pressure.

8. A hermetic enclosure having an air pressure adjustable function in accordance with claim 7, wherein:

said main body and said door of said hermetic enclosure are jointed with a sliding means.

9. A hermetic enclosure having an air pressure adjustable function in accordance with claim 7, wherein:

said hermetic enclosure changes said volume of said hermetic enclosure by making a clearance between said main body and said door of said hermetic enclosure increase or decrease in one axis direction or the circumference direction.

10. A hermetic enclosure having an air pressure adjustable function in accordance with claim 7, comprising:

a separation preventing means that prevents said main body and said door of said hermetic enclosure from separating.

11. A hermetic enclosure having an air pressure adjustable function in accordance with claim 7, further comprising:

an air pressure detecting means for detecting said inside and outside air pressure of said hermetic enclosure or an air pressure difference between said inside and outside of said hermetic enclosure.

12. A hermetic enclosure having an air pressure adjustable function, comprising:

a main body having a clearance part and a packing fixing groove;

a door; and packing that is fixed to said packing fixing groove of said main body; wherein:

said door is jointed with said main body by placing said packing between said door and said main body in a state that said door is able to slide on said packing, and when inside and outside air pressure of said hermetic enclosure becomes different, said door moves on said packing and said clearance part of said main body is changed, and said inside and outside air pressure is adjusted to be almost equal.

13. A hermetic enclosure having an air pressure adjustable function in accordance with claim 12, further comprising:

a door separation preventing means for preventing said door from separating from said main body.

14. A hermetic enclosure having an air pressure adjustable function in accordance with claim 12, wherein:

said packing fixing groove is added to said main body by one or more and the same added number of said packing is added and fixed to said added packing fixing grooves.

15. A hermetic enclosure having an air pressure adjustable function in accordance with claim 12, wherein:

said door is added by one or more and said added door is jointed with said main body in which the same added number of said packing fixing groove is added and the same added number of said packing is fixed to said added packing fixing groove.

16. A hermetic enclosure having an air pressure adjustable function in accordance with claim 12, further comprising:

an air pressure detecting means for detecting said inside and outside air pressure of said hermetic enclosure and providing a detected result;

a door moving distance deciding means for providing a decided result for deciding a door moving distance and direction based on the detected result at said air pressure detecting means; and a door moving means for moving said door based on the decided result at said door moving distance deciding means.

17. A hermetic enclosure having an air pressure adjustable function, comprising:

a main body having a clearance part;

a door having a packing fixing groove; and packing that is fixed to said packing fixing groove of said door; wherein:

said door is jointed with said main body by placing said packing between said door and said main body in a state that said door is able to slide on the surface of said main body, and when inside and outside air pressure of said hermetic enclosure becomes different, said door having said packing moves on the surface of said main body and said clearance part of said main body is changed, and said inside and outside air pressure is adjusted to be almost equal.

18. A hermetic enclosure having an air pressure adjustable function in accordance with claim 17, further comprising:

a door separation preventing means for preventing said door from separating from said main body.

19. A hermetic enclosure having an air pressure adjustable function in accordance with claim 17, wherein:

said packing fixing groove is added to said door by one or more and the same added number of said packing is added and fixed to said added packing fixing grooves.

20. A hermetic enclosure having an air pressure adjustable function in accordance with claim 17, wherein:

said door is added by one or more and said added door is jointed with said main body in a state that the same added number of said packing fixing groove is added to said added door and the same added number of said packing is fixed to said added packing fixing groove.

21. A hermetic enclosure having an air pressure adjustable function in accordance with claim 17, further comprising:

an air pressure detecting means for detecting said inside and outside air pressure of said hermetic enclosure and providing a detected result;

a door moving distance deciding means for providing a decided result for deciding a door moving distance and direction based on the detected result at said air pressure detecting means; and a door moving means for moving said door based on the decided result at said door moving distance deciding means.

22. A hermetic enclosure having an air pressure adjustable function, in which a main body of said hermetic enclosure or a door of said hermetic enclosure is movable, and which moves said main body or said door of said hermetic enclosure so that the volume of said hermetic enclosure is changed; and said main body and said door of said hermetic enclosure are jointed with a sliding means.

23. A hermetic enclosure having an air pressure adjustable function, in which a main body of said hermetic enclosure or a door of said hermetic enclosure is movable, and which moves said main body or said door of said hermetic enclosure so that the volume of said hermetic enclosure is changed;

said volume of said hermetic enclosure is changed by making said main body or said door of said hermetic enclosure move so that inside air pressure of said hermetic enclosure is made to be almost equal to outside air pressure; and said main body and said door of said hermetic enclosure are jointed with a sliding means.

* * * * *